(12) United States Patent
Ingle et al.

(10) Patent No.: US 7,825,038 B2
(45) Date of Patent: Nov. 2, 2010

(54) CHEMICAL VAPOR DEPOSITION OF HIGH QUALITY FLOW-LIKE SILICON DIOXIDE USING A SILICON CONTAINING PRECURSOR AND ATOMIC OXYGEN

(75) Inventors: Nitin K. Ingle, Santa Clara, CA (US); Zheng Yuan, Fremont, CA (US); Paul Gee, San Jose, CA (US); Kedar Sapre, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/754,440

(22) Filed: May 29, 2007

(65) Prior Publication Data

US 2007/0281496 A1    Dec. 6, 2007

Related U.S. Application Data

(60) Provisional application No. 60/803,493, filed on May 30, 2006, provisional application No. 60/803,489, filed on May 30, 2006, provisional application No. 60/803,481, filed on May 30, 2006, provisional application No. 60/803,499, filed on May 30, 2006.

(51) Int. Cl.
    *H01L 21/31*    (2006.01)
(52) U.S. Cl. .................. 438/778; 438/787; 438/788
(58) Field of Classification Search .......... 438/778, 438/787, 788; 427/579
    See application file for complete search history.

(56) References Cited

U.S. PATENT DOCUMENTS

| | | | |
|---|---|---|---|
| 4,147,571 A | 4/1979 | Stringfellow et al. | |
| 4,816,098 A | 3/1989 | Davis et al. | |
| 4,818,326 A | 4/1989 | Liu et al. | |
| 4,931,354 A | 6/1990 | Wakino et al. | |

(Continued)

FOREIGN PATENT DOCUMENTS

DE    19654737 A1    7/1997

(Continued)

OTHER PUBLICATIONS

G. Gulleri et al, "Deposition Temperature Determination of HDPCVD Silicon Dioxide Films", 2005, Microelectronic Engineering, vol. 82, pp. 236-241.*

(Continued)

*Primary Examiner*—David Vu
*Assistant Examiner*—Suberr Chi
(74) *Attorney, Agent, or Firm*—Townsend and Townsend and Crew

(57) ABSTRACT

Methods of depositing a silicon oxide layer on a substrate are described. The methods may include the steps of providing a substrate to a deposition chamber, generating an atomic oxygen precursor outside the deposition chamber, and introducing the atomic oxygen precursor into the chamber. The methods may also include introducing a silicon precursor to the deposition chamber, where the silicon precursor and the atomic oxygen precursor are first mixed in the chamber. The silicon precursor and the atomic oxygen precursor react to form the silicon oxide layer on the substrate, and the deposited silicon oxide layer may be annealed. Systems to deposit a silicon oxide layer on a substrate are also described.

22 Claims, 7 Drawing Sheets

U.S. PATENT DOCUMENTS

| | | | |
|---|---|---|---|
| 5,016,332 A | 5/1991 | Reichelderfer et al. | |
| 5,110,407 A | 5/1992 | Ono et al. | |
| 5,393,708 A | 2/1995 | Hsia et al. | |
| 5,426,076 A | 6/1995 | Moghadam | |
| 5,558,717 A | 9/1996 | Zhao et al. | |
| 5,587,014 A | 12/1996 | Iyechika et al. | |
| 5,622,784 A | 4/1997 | Okaue et al. | |
| 5,635,409 A | 6/1997 | Moslehi | |
| 5,691,009 A | 11/1997 | Sandhu | |
| 5,786,263 A | 7/1998 | Perera | |
| 5,853,607 A | 12/1998 | Zhao et al. | |
| 5,937,308 A | 8/1999 | Gardner et al. | |
| 5,937,323 A * | 8/1999 | Orczyk et al. | 438/624 |
| 6,008,515 A | 12/1999 | Hsia et al. | |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,180,490 B1 | 1/2001 | Vassiliev et al. | |
| 6,207,587 B1 | 3/2001 | Li et al. | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 * | 1/2003 | Thomas | 438/787 |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,566,278 B1 | 5/2003 | Harvey et al. | |
| 6,596,654 B1 | 7/2003 | Bayman et al. | |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,867,086 B1 | 3/2005 | Chen et al. | |
| 6,890,403 B2 | 5/2005 | Cheung et al. | |
| 6,900,067 B2 | 5/2005 | Kobayashi et al. | |
| 6,955,836 B2 | 10/2005 | Kumagi et al. | |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,115,419 B2 | 10/2006 | Suzuki | |
| 7,129,185 B2 | 10/2006 | Aoyama et al. | |
| 7,148,155 B1 | 12/2006 | Tarafdar et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,498,273 B2 | 3/2009 | Mallick et al. | |
| 7,524,735 B1 | 4/2009 | Gauri et al. | |
| 7,541,297 B2 | 6/2009 | Mallick et al. | |
| 7,745,352 B2 | 6/2010 | Mallick et al. | |
| 2001/0021595 A1 | 9/2001 | Jang et al. | |
| 2001/0029114 A1 | 10/2001 | Vulpio et al. | |
| 2001/0038919 A1 | 11/2001 | Berry, III et al. | |
| 2001/0054387 A1 | 12/2001 | Frankel et al. | |
| 2002/0048969 A1 * | 4/2002 | Suzuki et al. | 438/778 |
| 2002/0081817 A1 | 6/2002 | Bhakta et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 | 2/2004 | Zhao et al. | |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0219780 A1 | 11/2004 | Ohuchi | |
| 2004/0241342 A1 * | 12/2004 | Karim et al. | 427/585 |
| 2005/0001556 A1 | 1/2005 | Hoffman et al. | |
| 2005/0019494 A1 | 1/2005 | Moghadam et al. | |
| 2005/0026443 A1 | 2/2005 | Goo et al. | |
| 2005/0062165 A1 | 3/2005 | Saenger et al. | |
| 2005/0087140 A1 | 4/2005 | Yuda et al. | |
| 2005/0142895 A1 * | 6/2005 | Ingle et al. | 438/787 |
| 2005/0181555 A1 | 8/2005 | Haukka et al. | |
| 2005/0186731 A1 | 8/2005 | Derderian et al. | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Curie | |
| 2006/0014399 A1 | 1/2006 | Joe | |
| 2006/0030165 A1 * | 2/2006 | Ingle et al. | 438/795 |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1 | 7/2007 | Weber | |
| 2007/0181966 A1 | 8/2007 | Watatani et al. | |
| 2007/0232082 A1 | 10/2007 | Balseanu et al. | |
| 2007/0281495 A1 | 12/2007 | Mallick et al. | |
| 2007/0281496 A1 | 12/2007 | Ingle et al. | |
| 2008/0085607 A1 | 4/2008 | Yu et al. | |
| 2008/0102223 A1 | 5/2008 | Wagner et al. | |

| | | | |
|---|---|---|---|
| 2009/0061647 | A1 | 3/2009 | Mallick et al. |

FOREIGN PATENT DOCUMENTS

| | | | |
|---|---|---|---|
| EP | 1717848 | A | 11/2006 |
| JP | 01241826 | A | 9/1989 |
| WO | WO 02/077320 | A1 | 10/2002 |
| WO | WO 03/066933 | A | 8/2003 |
| WO | WO 2005/078784 | A | 8/2005 |
| WO | WO 2007/040856 | A2 | 4/2007 |
| WO | WO 2007/140376 | A | 12/2007 |
| WO | WO 2007/140424 | A | 12/2007 |

OTHER PUBLICATIONS

Coltrin, M.E., et al., "Chemistry of AlGaN Particulate Formation," National Nuclear Security Administration, Physical, Chemical, & Nano Sciences Center, Research Briefs, 2005, pp. 42-43.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

PCT International Search Report and Written Opinion mailed on Jul. 30, 2008 by the European Patent Office, International U.S. Appl. No. PCT/US2007/081139, 19 pages.

PCT International Search Report and Written Opinion mailed Jan. 6, 2009, International Application No. PCT/US08/82365, 12 pages.

EP Search Report mailed Jun. 9, 2009; Application No. 08167338.6, 9 pages.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, Ch. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

International Search Report and Written Opinion mailed Apr. 12, 2010; International Application No. PCT/US2009/055073, 12 pages.

* cited by examiner

CHEMICAL VAPOR DEPOSITION OF HIGH QUALITY FLOW-LIKE SILICON DIOXIDE USING A SILICON CONTAINING PRECURSOR AND ATOMIC OXYGEN

CROSS-REFERENCES TO RELATED APPLICATIONS

This application claims the benefit of U.S. Provisional Application No. 60/803,493 by Ingle et al, filed May 30, 2006 and titled "CHEMICAL VAPOR DEPOSITION OF HIGH QUALITY FLOW-LIKE SILICON DIOXIDE USING A SILICON CONTAINING PRECURSOR AND ATOMIC OXYGEN". This application is also related to co-assigned U.S. Provisional App. No. 60/803,489, by Munro et al, filed May 30, 2006 and titled "A METHOD FOR DEPOSITING AND CURING LOW-K FILMS FOR GAPFILL AND CONFORMAL FILM APPLICATIONS". This application is also related to U.S. Provisional Application No. 60/803,481, by Chen et al, filed May 30, 2006 and titled "A NOVEL DEPOSITION-PLASMA CURE CYCLE PROCESS TO ENHANCE FILM QUALITY OF SILICON DIOXIDE". In addition, this application is related to U.S. Provisional Application No. 60/803,499 by Lubomirsky, filed May 30, 2006 and titled "PROCESS CHAMBER FOR DIELECTRIC GAPFILL". The entire contents of the priority U.S. Provisional patent application and the related applications are herein incorporated by reference for all purposes.

BACKGROUND OF THE INVENTION

As the device density on integrated circuits continues to increase, the size and distance between device structures continue to decrease. The narrower widths in the gaps of the structures and the trenches between structures increases the ratio of height to width (i.e., the aspect ratio) in these formations. In other words, the continued miniaturization of integrated circuit elements is shrinking the horizontal width within and between these elements faster than their vertical height.

While the ability to make device structures with ever increasing aspect ratios has allowed more of the structures (e.g., transistors, capacitors, diodes, etc.) to be packed onto the same surface area of a semiconductor chip substrate, it has also created fabrication problems. Once of these problems is the difficulty of completely filling the gaps and trenches in these structures without creating a void or seam during the filling process. Filling gaps and trenches with dielectric materials like silicon oxide is necessary to electrically isolate nearby device structures from each other. If the gaps were left empty, there would be too much electrical noise, and current leakage for the devices to operate properly (or at all).

When gap widths were larger (and aspect ratios smaller) the gaps were relatively easy to fill with a rapid deposit of a dielectric material. The deposition material would blanket the sides and bottom of the gap and continue to fill from the bottom up until the crevice or trench was fully filled. As aspect ratios increased however, it became more difficult to fill the deep, narrow trench without having a blockage start a void or seam in the fill volume.

Voids and seams in a dielectric layer cause create problems both during semiconductor device fabrication and in the finished devices. The voids and seams are formed randomly in the dielectric layer and have unpredictable sizes, shapes, locations and population densities. This results in unpredictable and inconsistent post-deposition processing of the layer, such as even etching, polishing, annealing, etc. The voids and seams in the finished devices also create variations in the dielectric qualities of gaps and trenches in device structures. This can result in uneven, and inferior device performance due to electrical crosstalk, charge leakage, and even shorting within and between device elements.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce the degree to which the deposited material builds up at the top or middle of the trench and eventually seals off the top of a void. Unfortunately however, slowing the deposition rate means increasing the deposition time, which reduces processing efficiency and production rates.

Another technique to control void formation is to increase the flowability of the deposited dielectric material. A material with more flowability can more quickly fill a void or seam and prevent it from becoming a permanent defect in the fill volume. Increasing the flowability of an silicon oxide dielectric material often involves adding water vapor or peroxide (e.g., $H_2O_2$) to the mix of precursors used to form the oxide layer. The water vapor creates more Si—OH bonds in the deposited film, which impart an increased flowability to the film. Unfortunately however, increasing the moisture level during a silicon oxide deposition can also adversely effect the properties of the deposited film, including its density (i.e., an increased wet etch rate ratio (WERR)) and dielectric properties (i.e., an increased k-value).

Thus, there remains a need for dielectric deposition systems and processes that can deposit voidless, seamless, dielectric films into gaps, trenches, and other device structures with high aspect ratios. There also remains a need for systems and processes that can deposit a dielectric materials at high deposition rates and flowability characteristics that do not adversely effect the quality of the finished fill. These and other aspects of dielectric film deposition are addressed by the present invention.

BRIEF SUMMARY OF THE INVENTION

Embodiments of the invention include methods of depositing a silicon oxide layer on a substrate. The methods may include the steps of providing a substrate to a deposition chamber, generating an atomic oxygen precursor outside the deposition chamber, and introducing the atomic oxygen precursor into the chamber. The methods may also include introducing a silicon precursor to the deposition chamber, where the silicon precursor and the atomic oxygen precursor are first mixed in the chamber. The silicon precursor and the atomic oxygen precursor react to form the silicon oxide layer on the substrate. The methods may also include annealing the deposited silicon oxide layer.

Embodiments of the invention also include methods of forming a silicon oxide layer on a substrate. The methods may include the steps of providing a silicon wafer substrate to a reaction chamber, and generating an atomic oxygen precursor from a dissociation of molecular oxygen in a high-density argon plasma. The atomic oxygen precursor may be generated in a remote plasma generating chamber that is external to the reaction chamber. The methods may also include mixing the atomic oxygen precursor with a silicon precursor in the reaction chamber, where the atomic oxygen precursor and the silicon precursor are not mixed before reaching the reaction chamber. The silicon oxide layer deposited on the substrate includes the reaction products from the reaction of the atomic oxygen with the silicon precursor.

Embodiments of the invention may still further include systems to deposit a silicon oxide layer on a substrate. The systems may include a deposition chamber in which the substrate is held, and a remote plasma generating system coupled to the deposition chamber, where the plasma generating system is used to generate an atomic oxygen precursor. The systems may also include a silicon precursor source used to supply a silicon precursor to the deposition chamber, and precursor handling system used to direct flows of the atomic oxygen precursor and the silicon precursor into the deposition chamber. The precursor handling system may be configured to keep the atomic oxygen and silicon precursors from mixing before they enter the deposition chamber.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for depositing a silicon oxide layer with high flowability that is then cured (i.e., annealed) into a high-quality oxide layer or fill. The high flowability of the initially formed oxide allows it to fill high aspect ratio gaps and trenches (e.g., aspect ratios greater than 5:1) without gaps or seams. The curing step then drives out moisture to leave behind a dense oxide film having a wet etch rate ratio (WERR) that may approach the practical limit for silicon oxide films (e.g., WERRs down to about 1.8 to about 1.4). For films made with carbon containing silicon precursors, low-k oxide films may be produced that also have high initial flowability and high post-cure quality.

The methods of the invention include the remote generation of reactive atomic oxygen outside a deposition/reaction chamber. The atomic oxygen is first mixed with a silicon precursor in the deposition chamber, where they quickly react even at low temperatures and pressures and deposit silicon oxide on a substrate. The oxide formed is rich in hydroxyl groups bonded to the silicon, which make the oxide highly flowable. Once deposited, the oxide will flow quickly even at low temperatures to fill nascent voids and seams during a gap or trench fill. Then after the deposition, the curing step converts many of the Si—OH groups into pure silicon dioxide and water vapor, which is driven out of the deposited film.

In embodiments where low-k films rich in Si—C bonds are deposited, the curing process may be divided into a first step to eliminate the carbon by hydrolyzing the Si—C bonds into Si—OH bonds, followed by a second step to eliminate the hydroxyl groups and drive off the resulting moisture. This may be done by first performing a wet anneal (e.g., steam anneal up to about 950° C.), were $H_2O$ hydrolyzes the Si—C bonds into Si—OH bonds, followed by a dry anneal (e.g., dry $N_2$ at 900° C.) to convert the Si—OH into silicon oxide. Additional description of embodiments of methods and processes of the invention will now be discussed.

Exemplary Oxide Layer Formation Processes

Figure 1:
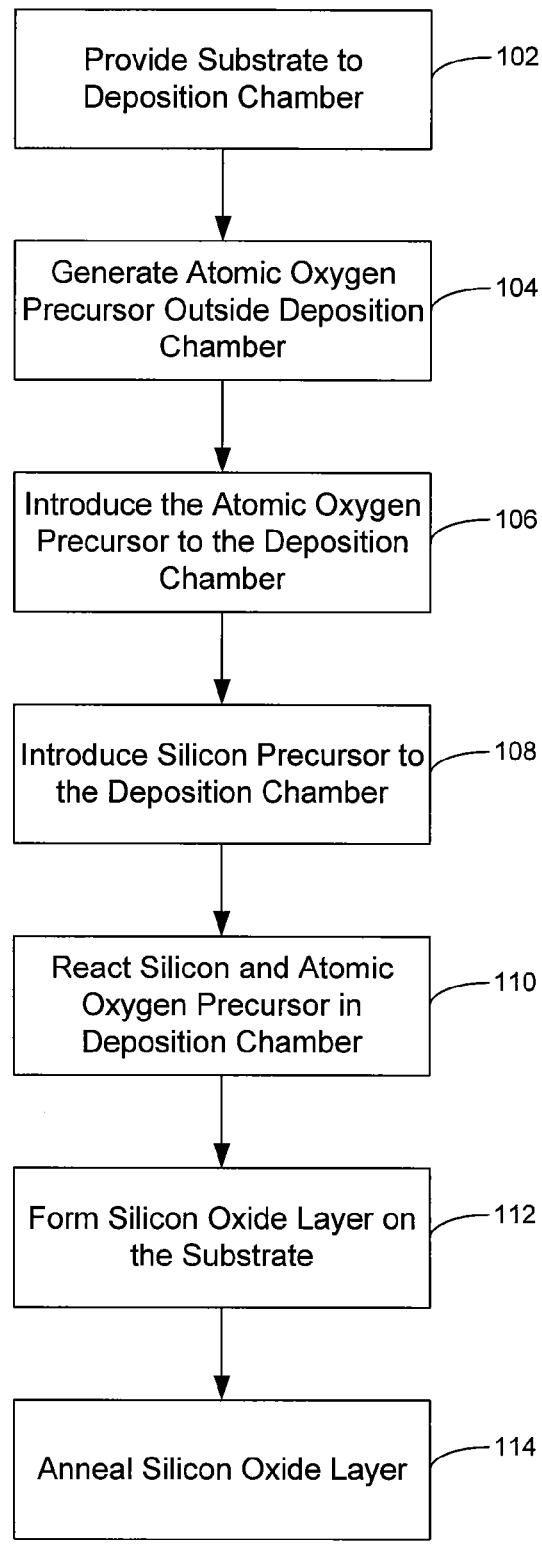
FIG. 1 is a flowchart showing steps in methods of forming oxide layers on substrates according to embodiments of the invention.

FIG. 1 shows a flowchart that includes steps in a method 100 of forming an oxide layers on a substrate according to embodiments of the invention. The method 100 includes providing a substrate to a deposition chamber 102. The substrate may be a semiconductor wafer (e.g., silicon wafer having a diameter of about 300 mm or less; a silicon wafer with a diameter of about 100 mm, 150 mm, 200 mm, 300 mm, 400 mm, etc.) and may include structures, device components, etc., formed in earlier processes. For example, the substrate may include gaps, trenches, etc., with high height to width aspect ratios (e.g., an aspect ratio of 5:1 or more, 6:1 or more, 7:1 or more, 8:1 or more, 9:1 or more, 10:1 or more, 11:1 or more, 12:1 more, etc.).

The method 100 also includes the remote generation of an atomic oxygen precursor at a location outside the deposition chamber 104. The atomic oxygen may be generated by the dissociation of an oxygen containing precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the oxygen containing precursor to generate the atomic oxygen may be done by thermal dissociation, ultraviolet light dissociation, and/or plasma dissociation, among other methods. Plasma dissociation may involve striking a plasma from helium, argon, hydrogen ($H_2$), xenon, ammonia ($NH_3$), etc., in a remote plasma generating chamber and introducing the oxygen precursor to the plasma to generate the atomic oxygen precursor.

The reactive atomic oxygen plasma is then introduced to the deposition chamber 106 where it may mix for the first time with a silicon precursor, which is also introduced to the chamber 108. The highly reactive atomic oxygen will react with the silicon precursor (and other deposition precursors that may be present in the reaction chamber) at moderate temperatures (e.g., reaction temperatures less than 100° C.) and pressures (e.g., about 0.1 Torr to about 10 Torr; 0.5 to 6 Torr total chamber pressure, etc.) to form a silicon oxide film 110. During the deposition, the wafer may be adjusted (i.e., heated or cooled) by a wafer pedestal that supports the wafer to a temperature of about 0° C. to about 150° C.

The silicon precursor may include an organosilane compound and/or silicon compound that does not contain carbon. Silicon precursors without carbon may include silane ($SiH_4$), among others. Organosilane compounds may include compounds with direct Si—C bonding and/or compounds with Si—O—C bonding. Examples of organosilane silicon precursors may include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethyldimethyldimethoxydisilane, tetramethylcyclotetrasiloxane (TOMCATS), DMDMOS, DEMS, methyl triethoxysilane (MTES), phenyldimethylsilane, and phenylsilane, among others.

The silicon precursor may be mixed with a carrier gas before or during its introduction to the deposition chamber. A carrier gas may be an inactive gas that does not unduly interfere with the formation of the oxide film on the substrate. Examples of carrier gases include helium, neon, argon, nitrogen ($N_2$), and hydrogen ($H_2$), among other gases.

In embodiments of method 100, the atomic oxygen and silicon precursors are not mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet directs the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

Additional embodiments include sending the atomic oxygen and silicon precursors through separate ports of a multiport showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. Provisional Application No. 60/803,499 by Lubomirsky, filed May 30, 2006 and titled "PROCESS CHAMBER FOR DIELECTRIC GAPFILL", and the subsequent U.S. Non-Provisional Application with Ser. No. 11/754,858, filed the same day as the present application, both of which are herein incorporated by reference for all purposes.

As the atomic oxygen and silicon precursors react in the deposition chamber, they form the silicon oxide layer on the substrate deposition surface 112. The initial oxide layer has excellent flowability, and can quickly migrate into gaps, trenches, voids, seams, etc., in the structures present at the deposition surface. This allows the method 100 to provide oxide fills that are substantially free of voids and seams in gaps, trenches, and other surface structures that have high height to width aspect ratios (e.g., ARs of about 5:1, 6:1, 6:1, 8:1, 9:1, 10:1, 11:1, and 12:1 or more).

While not wishing to be bound to a particular theory, it is believed that the silicon precursor and the remotely generated atomic oxygen react to form a silicon oxide that has a high concentration of silicon-hydroxyl group (Si—OH) bonds. It's believed these bonds impart the increased flowability to the silicon oxide layer. The Si—OH bonds, however, also increase the wet etch rate ratio (WERR) and dielectric constant of the deposited layer, which can reduce the quality of the deposited oxide, and its effectiveness as a electrical insulator. Thus, the concentration of the Si—OH bonds are reduced by annealing (i.e., curing) the silicon oxide layer 114 following the deposition.

A post deposition anneal of the deposited silicon oxide layer 114 may be done in a single step, or multiple steps. A single step anneal may be done, for example, by heating the deposited layer to about 300° C. to about 100° C. (e.g., about 600° C. to about 900° C.) in a substantially dry atmosphere (e.g., dry nitrogen, helium, argon, etc.). The anneal removes moisture from the deposited layer and converts Si—OH groups into silicon oxide. The annealed silicon oxide layer has improved film quality (e.g., a WERR of about 6 to about 3, or less) and improved qualities as a dielectric (e.g., a k-value approaching or equal to pure silicon dioxide).

Multi-step anneals may include a two-step anneal where the layer first undergoes a wet anneal stage, such as heating the layer to, for example, up to about 950° C. (e.g., 650° C.) in the presence of steam. This may be followed by a dry anneal stage, where the layer is heated (e.g., about 900° C.) in an atmosphere that is substantially free of moisture (e.g., dry $N_2$). As noted above, multi-step anneals may be used in conjunction with an organosilicon precursor that forms a silicon oxide layer with substantial amounts of carbon (e.g., a substantial density of Si—C bonds). The first, wet anneal, helps replace a number of Si—C bonds with Si—OH bonds, while the dry anneal converts the Si—OH into silicon oxide bonds and drives off moisture from the layer.

In addition to wet and dry thermal annealing, other annealing techniques (alone or in combination) may be used to anneal the silicon oxide layer 114. These include a steam anneal, a plasma anneal, an ultraviolet light anneal, an e-beam anneal, and/or a microwave anneal, among others.

Figure 2:
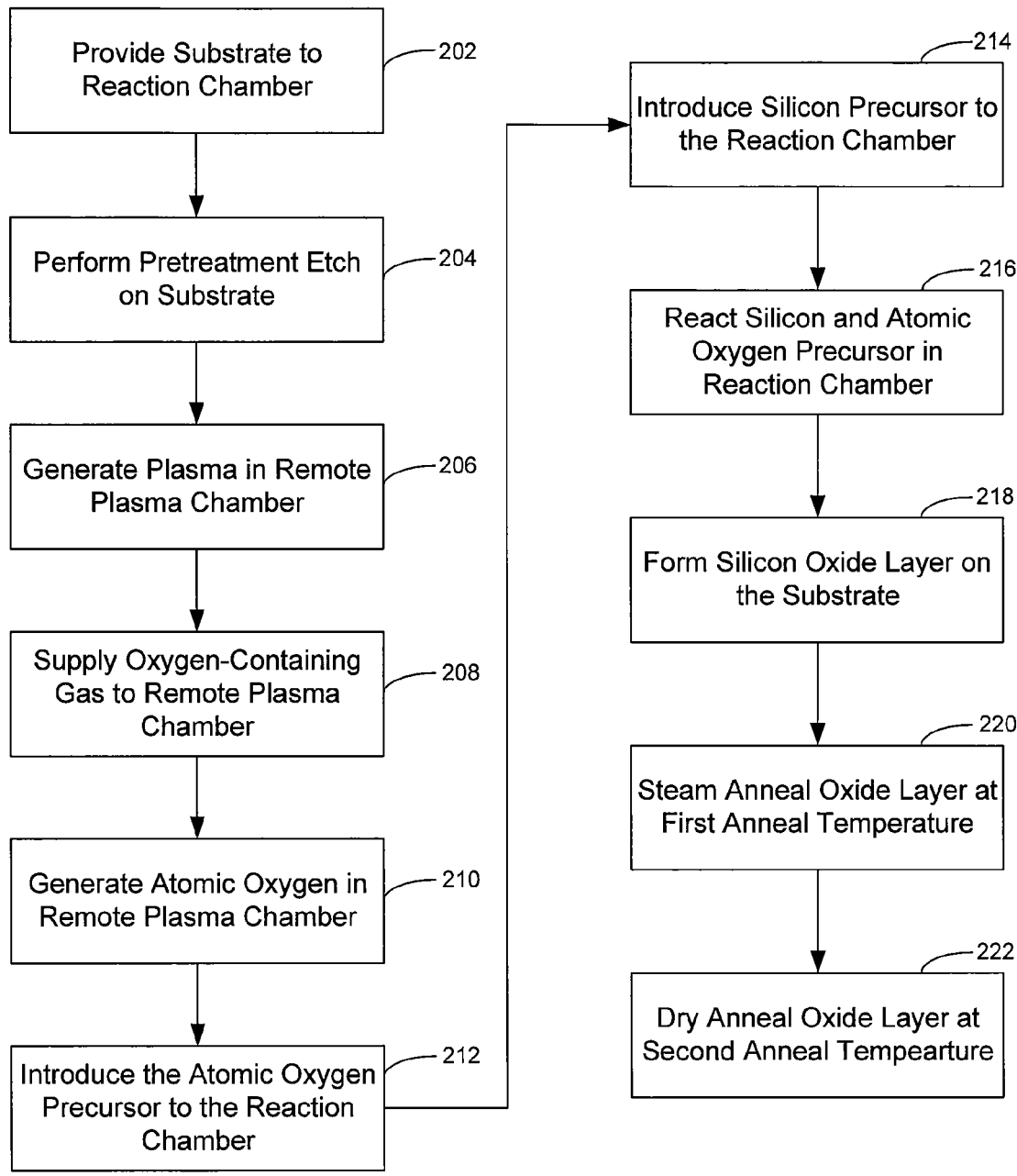
FIG. 2 illustrates steps in methods of forming oxide layers according to additional embodiments of the invention.

Referring now to FIG. 2, steps in a method 200 of forming oxide layers according to additional embodiments of the invention is shown. The method 200 includes providing a substrate 202 to a reaction chamber and performing an pretreatment etch on the substrate 204. The pretreatment etch may include a plasma etch (e.g., a high-density plasma etch with an argon plasma) to smooth substrate structures and remove surface impurities.

The method also includes generating a plasma in a remote plasma chamber 206 and supplying an oxygen containing gas (e.g., molecular oxygen) to the plasma chamber 208 to generate an atomic oxygen plasma 210. Embodiments of method 200 include using the plasma generated in the remote plasma chamber for the pretreatment etch on the substrate 204 before generating the atomic oxygen precursor. When the pretreatment etch is finished, the oxygen containing gas is introduced to the remote plasma chamber to generate the atomic oxygen precursor 210. The flow of plasma to the reaction chamber may be discontinued between the pretreatment and silicon oxide deposition steps, or may be allowed to flow continuously between the steps.

To start the deposition of the oxide layer on the substrate, the remotely generated atomic oxygen precursor is introduced to the reaction chamber 212 as well as the silicon precursor 214 (e.g., TEOS, OMCATS). In the reaction chamber, the two precursors react 216, and form a silicon oxide layer on the substrate 218. The oxide layer may be formed at a rate of about 250 Å/min to about 2 μm/min. Embodiments of method 200 include using a carbon containing silicon precursor which adds a significant amount of carbon (e.g., Si—C and/or Si—O—C bonds) to the oxide layer. Thus, in method 200 a two-step anneal is performed starting with a steam anneal at a first anneal temperature 220, followed by a dry anneal at a second anneal temperature 222. The first anneal temperature (e.g., about 600° C. to about 950° C.) may be lower than the second anneal temperature (e.g., about 900° C. to about 1000° C.; about 950° C., etc.).

Figure 3:
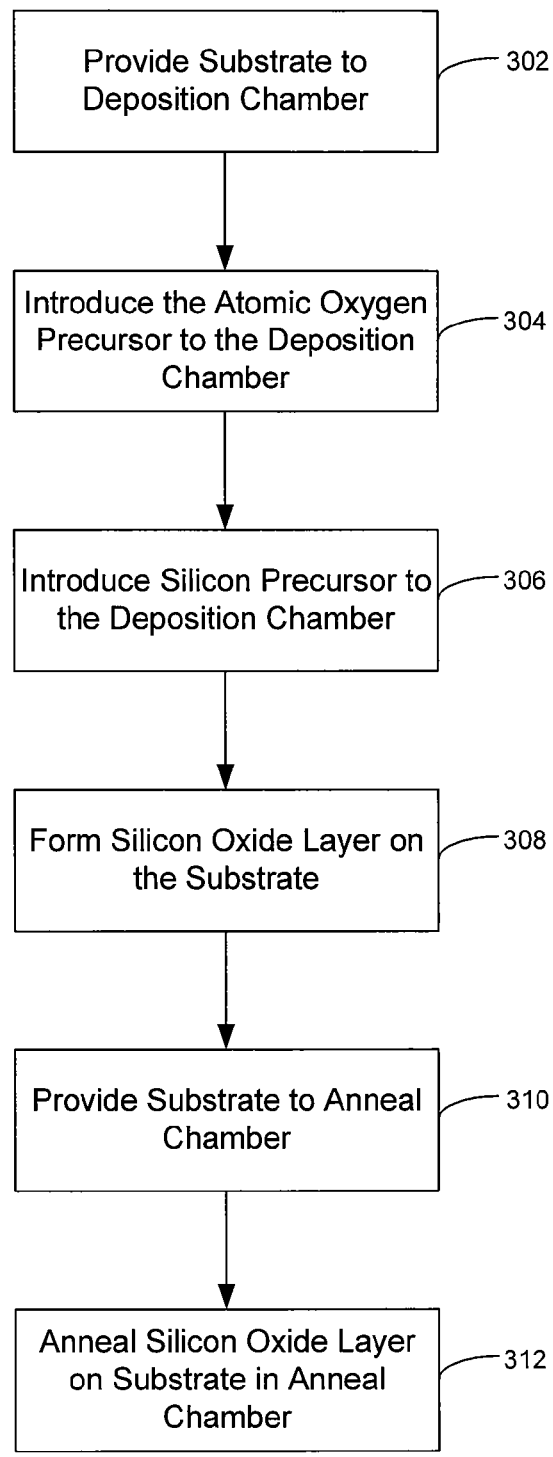
FIG. 3 shows steps in methods of forming oxide layers that use different chambers for depositing and curing the layers according to embodiments of the invention.

FIG. 3 shows embodiments of a method 300 of forming an oxide layer that uses different chambers for depositing and curing the layer. The method 300 includes providing a substrate to the deposition chamber 302 and introducing the atomic oxygen precursor 304 and silicon precursor 306 to the chamber. The precursors react in the deposition chamber and form the silicon oxide layer on the substrate 308.

At this point, the flow of the precursors to the deposition chamber is stopped, and the substrate is removed. It is then provided to a separate anneal chamber 310, where the anneal of the silicon oxide layer is performed 312. The transfer of the substrate from the deposition to the anneal chambers may be done under vacuum and/or in an inert atmosphere to prevent particulates, oxygen, and other contaminants from contacting the deposited layer. For example, the deposition and anneal chambers may be part of a larger group of chambers that form semiconductor device structures, PMDs, ILDs, metallization structures, cap layers, etc. on a wafer substrate. Movement of the wafer from one chamber to another is done by automated mechanisms (e.g., robotic arms, conveyor belts, etc.) in a controlled atmosphere.

Figure 4:
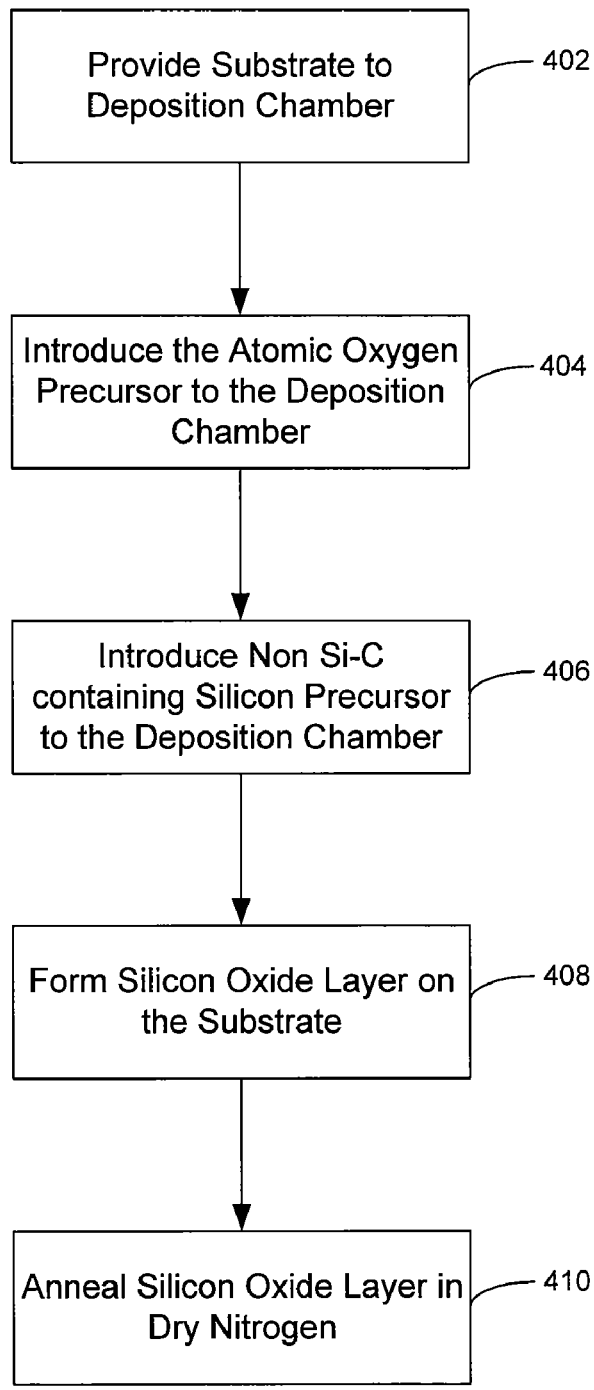
FIG. 4 is a flowchart showing steps in methods of forming oxide layers from non Si—C bond containing silicon precursors according to embodiments of the invention.
Figure 5:
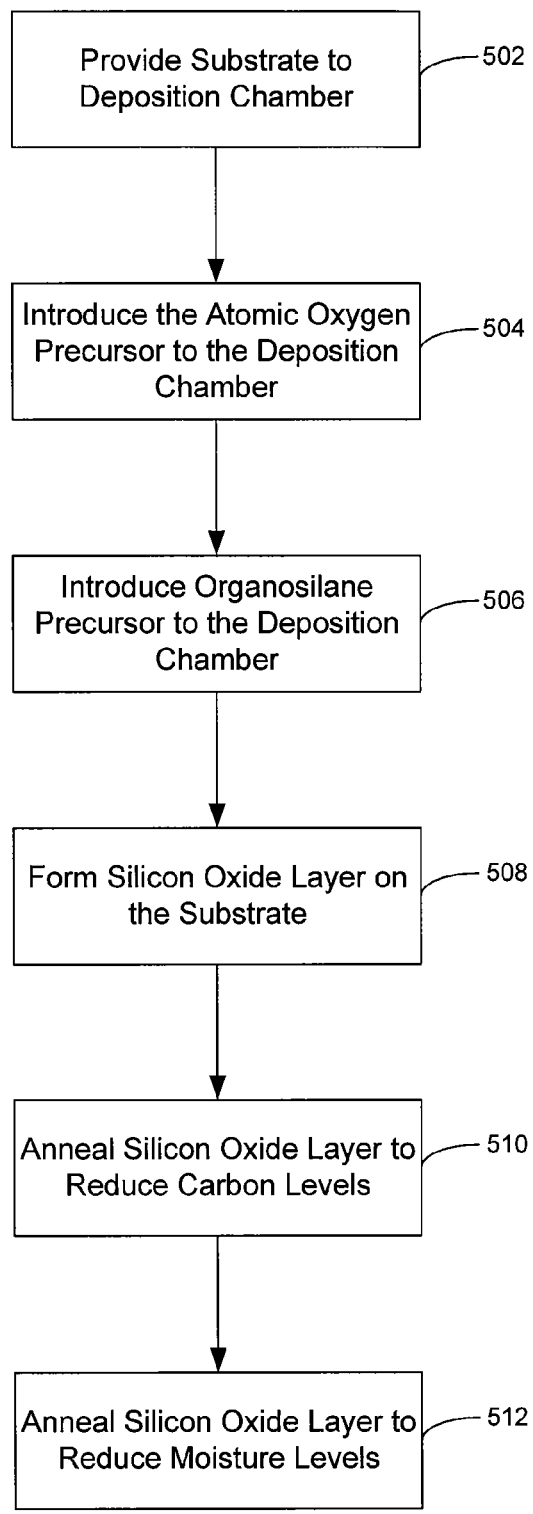
FIG. 5 is a flowchart showing steps in methods of forming oxide layers from silicon precursors that contain Si—C bonds according to embodiments of the invention.

Referring now to FIGS. 4 and 5, embodiments are described of methods of forming a silicon oxide layer with and without a carbon containing silicon precursor. FIG. 4 shows steps in an embodiment of a method 400 of forming oxide layers from non Si—C bond containing silicon precursor. The method 400 includes providing a substrate to the deposition chamber 402, and introducing the atomic oxygen precursor 404 and the non-carbon containing silicon precursor 406 to the chamber. The precursors react in the chamber to form a silicon oxide layer on the substrate 408, followed by an anneal. The anneal of the silicon oxide layer 410 may be a single step anneal in a dry nitrogen atmosphere at about 800° C. to about 1000° C. Because no carbon is used in the silicon precursor, the carbon level in the deposited oxide is low, and a steam anneal to remove the carbon is not necessary.

Method 500 shown in FIG. 5, however, uses a carbon containing silicon precursor (e.g., an organosilane) that leaves an significant amount of carbon in the initial silicon oxide layer deposited on the substrate. Similar to FIG. 4, the embodiment of the method 500 shown in FIG. 5 includes providing a substrate to a deposition chamber 502, and introducing an atomic oxygen precursor to the chamber 504. However, the silicon precursor introduced is a carbon-containing organosilane precursor 506. The atomic oxygen and organosilane precursor react to form a carbon containing silicon oxide layer on the substrate 508. Following the deposition, a two-stage anneal is performed, starting with a first anneal to reduce the carbon level in the silicon oxide layer 510, and followed with a second anneal to reduce the moisture levels (i.e., the $H_2O$ and Si—OH levels) levels in the layer 512. The first anneal may include a steam anneal that hydrolyzes at least a portion of the Si—C bonds, and/or a plasma etch, e-beam, or UV light anneal that decomposes larger organic molecules into smaller ones. The second anneal may further oxidize the smaller carbon molecules into CO, $CO_2$, formic acid, etc., that are removed with the moisture. In some embodiments, the first anneal is a steam anneal and the second anneal is a dry nitrogen anneal.

It should be appreciated that the examples of the methods shown and described in FIGS. 1-5 are just some of the many embodiments that may be used to deposit an oxide layer on a substrate according to the present invention. Additional embodiments may include additional steps, and different sequences of steps to form the oxide layer. For example, while FIG. 1 shows atomic oxygen introduced in an earlier step than the silicon precursor, introducing both precursors at the same time, or introducing the silicon precursor before the atomic oxygen precursor are also contemplated by method 100. Having described some of the embodiments of the methods that may be used in accordance with the invention, a description of embodiments of substrate processing systems is now described.

Exemplary Substrate Processing System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

Figure 6A:
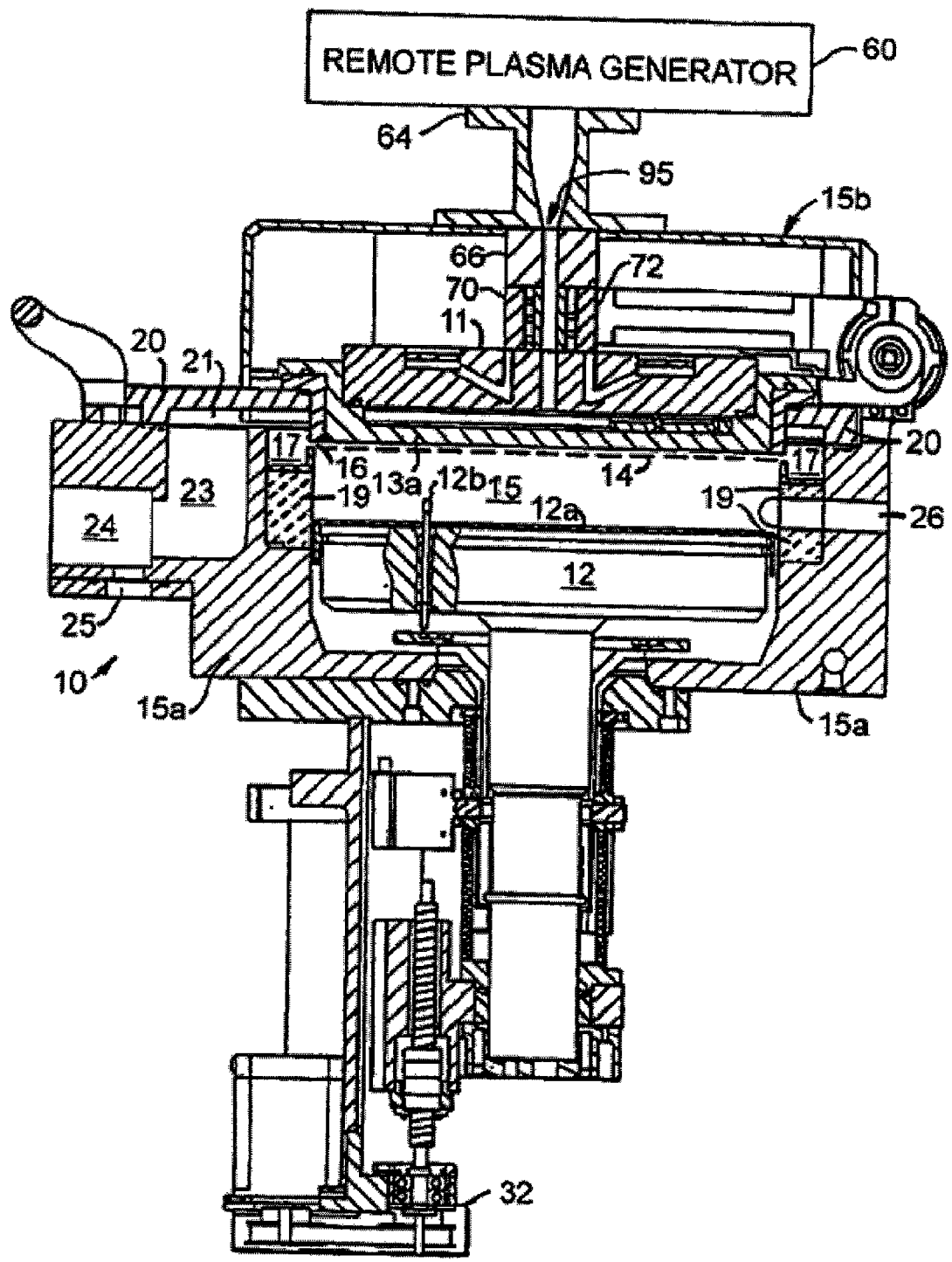
FIG. 6A shows a vertical cross-sectional view of a substrate processing system that may be used to form silicon oxide layers according to embodiments of the invention.

One suitable substrate processing system in which can be modified to utilize embodiments in accordance with the present invention is shown and described in co-assigned U.S. Pat. Nos. 6,387,207 and 6,830,624, which are incorporated herein by reference for all purposes. FIG. 6A is vertical, cross-sectional views of a CVD system 10, having a vacuum or processing chamber 15 that includes a chamber wall 15a and a chamber lid assembly 15b.

The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 6A) and an upper processing position (indicated by dashed line 14 in FIG. 6A), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate 42 and then through holes 13b in gas distribution faceplate 13a.

Before reaching the manifold 11, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 6A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 6B:
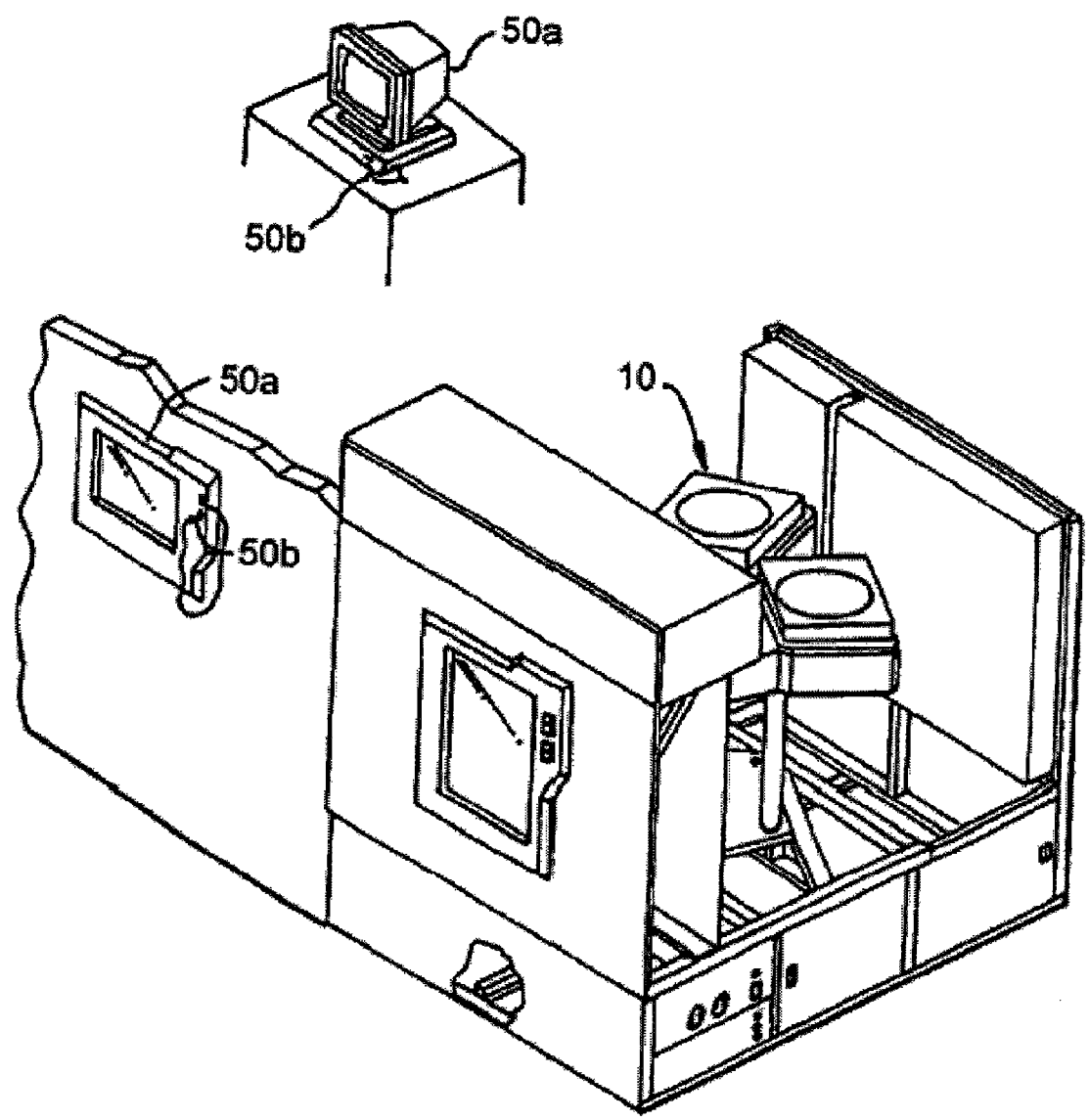
FIG. 6B is a simplified diagram of a system monitor/controller component of a substrate processing system according to embodiments of the invention.

The interface between a user and the controller 34 is via a CRT monitor 50a and light pen 50b, shown in FIG. 6B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

FIG. 6A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 6A. The adaptor 64 is typically made of metal. A mixing device 70 is coupled to the upstream side of the gas distribution manifold 11 (FIG. 6A). The mixing device 70 includes a mixing insert 72 disposed inside a slot 74 of a mixing block for mixing process gases. A ceramic isolator 66 is placed between the mounting adaptor 64 and the mixing device 70 (FIG. 6A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing a silicon oxide layer on a substrate, the method comprising:
   providing a substrate to a deposition chamber;
   generating atomic oxygen outside the deposition chamber, and introducing the atomic oxygen into the chamber;
   introducing a silicon precursor to the deposition chamber, wherein the silicon precursor and the atomic oxygen are first mixed in the chamber;
   reacting the silicon precursor and the atomic oxygen to form the silicon oxide layer on the substrate wherein the substrate is maintained at a temperature between about 0° C. and about 150° C. as the silicon oxide layer is formed, wherein the silicon oxide layer is initially-flowable following deposition; and
   annealing the deposited silicon oxide layer.

2. The method of claim 1, wherein the substrate comprises a silicon wafer having a diameter of about 300 mm or less.

3. The method of claim 1, wherein a plurality of structures are formed on a surface of the substrate, wherein the structures include gaps and trenches having height to width aspect ratios of 7:1 or more.

4. The method of claim 1, wherein the atomic oxygen is formed by:
   forming a plasma from a gas mixture comprising argon; and
   introducing an oxygen precursor to the plasma, wherein the oxygen precursor dissociates to form the atomic oxygen.

5. The method of claim 4, wherein the oxygen precursor is selected from the group consisting of molecular oxygen, ozone, water vapor ($H_2O$), and nitrogen dioxide.

6. The method of claim 1, wherein the atomic oxygen is formed by:
   introducing an oxygen precursor into a photodissociation chamber; and
   exposing the oxygen precursor to ultraviolet light, wherein the ultraviolet light dissociates the oxygen precursor to form the atomic oxygen.

7. The method of claim 6, wherein the oxygen precursor is selected from the group consisting of molecular oxygen, ozone, and nitrogen dioxide.

8. The method of claim 1, wherein the silicon precursor is selected from the group consisting of silane, dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethyldimethyldimethoxydisilane, tetramethylcyclotetrasiloxane (TOMCATS), DMDMOS, DEMS, methyl triethoxysilane (MTES), phenyldimethylsilane, and phenylsilane.

9. The method of claim 1, wherein the silicon precursor is mixed with a carrier gas comprising helium.

10. The method of claim 1, wherein the deposition chamber comprises a wafer pedestal that supports the substrate, wherein the substrate temperature is adjusted by the wafer pedestal.

11. The method of claim 1, wherein the deposition chamber has a pressure of about 0.1 Torr to about 10 Torr as the silicon oxide layer is formed.

12. The method of claim 1, wherein the silicon oxide layer is formed at a rate of about 250 Å/min to about 2 μm/min.

13. The method of claim 1, wherein the deposited silicon oxide annealing step comprises a thermal anneal, a steam anneal, a plasma anneal, an ultraviolet light anneal, an e-beam anneal, or a microwave anneal.

14. The method of claim 1, wherein the annealing of the deposited silicon oxide layer comprises:

heating the substrate at a first anneal temperature in the presence of steam; and heating the substrate at a second anneal temperature in dry nitrogen.

15. The method of claim 14, wherein the first anneal temperature is up to about 950° C. and the second anneal temperature is about 900° C.

16. The method of claim 1, wherein the method comprises exposing the substrate to a pretreatment plasma before introducing the atomic oxygen precursor or silicon precursor to the deposition chamber.

17. The method of claim 16, wherein the pretreatment plasma is a high-density plasma comprising argon, helium, hydrogen ($H_2$), xenon, or ammonia.

18. The method of claim 1, wherein the deposition chamber is part of a high-density plasma chemical vapor deposition (HDPCVD) system.

19. A method of forming a silicon oxide layer on a substrate, the method comprising:

providing a silicon wafer substrate to a reaction chamber;

generating atomic oxygen from a dissociation of molecular oxygen in a high-density argon plasma, wherein the atomic oxygen is generated in a remote plasma generating chamber that is external to the reaction chamber;

mixing the atomic oxygen with a silicon precursor in the reaction chamber, wherein the atomic oxygen and the silicon precursor are not mixed before reaching the reaction chamber; and depositing the silicon oxide layer on the substrate, wherein the silicon oxide layer comprises reaction products from the reaction of the atomic oxygen with the silicon precursor and the substrate is maintained at a temperature between about 0° C. and about 150° C. as the silicon oxide layer is deposited, wherein the silicon oxide layer is initially-flowable following deposition.

20. The method of claim 19, wherein the method further comprises annealing the deposited silicon oxide layer.

21. The method of claim 20, wherein the deposited silicon oxide annealing step comprises a thermal anneal, a steam anneal, a plasma anneal, an ultraviolet light anneal, an e-beam anneal, or a microwave anneal.

22. The method of claim 19, wherein the silicon precursor is selected from the group consisting of silane, dimethylsilane, trimethylsilane, tetramethylsilane, diethylsilane, tetramethylorthosilicate (TMOS), tetraethylorthosilicate (TEOS), phenyldimethylsilane, and phenylsilane.

* * * * *